US008680555B2

US 8,680,555 B2

(12) United States Patent
Jeong

(10) Patent No.: US 8,680,555 B2
(45) Date of Patent: *Mar. 25, 2014

(54) SEMICONDUCTOR LIGHT EMITTING DEVICE

(75) Inventor: Hwan Hee Jeong, Ulsan (KR)

(73) Assignee: LG Innotek Co., Ltd., Seoul (KR)

( * ) Notice: Subject to any disclaimer, the term of this patent is extended or adjusted under 35 U.S.C. 154(b) by 100 days.

This patent is subject to a terminal disclaimer.

(21) Appl. No.: 13/350,260

(22) Filed: Jan. 13, 2012

(65) Prior Publication Data

US 2012/0112232 A1 May 10, 2012

Related U.S. Application Data

(63) Continuation of application No. 12/950,449, filed on Nov. 19, 2010, now Pat. No. 8,115,227, which is a continuation of application No. 12/580,828, filed on Oct. 16, 2009, now Pat. No. 7,859,003.

(30) Foreign Application Priority Data

Oct. 16, 2008 (KR) .................. 10-2008-0101642

(51) Int. Cl.
 *H01L 33/00* (2010.01)
(52) U.S. Cl.
 USPC .. 257/98; 257/99; 257/E33.068; 257/E33.072
(58) Field of Classification Search
 USPC .................. 257/98, 99, E33.068, E33.072
 See application file for complete search history.

(56) References Cited

U.S. PATENT DOCUMENTS

| 6,504,180 | B1 | 1/2003 | Heremans et al. |
| 7,859,003 | B2 | 12/2010 | Jeong |
| 8,115,227 | B2 * | 2/2012 | Jeong ........................ 257/98 |
| 8,143,640 | B2 | 3/2012 | Lee |
| 2004/0104390 | A1 | 6/2004 | Sano et al. |
| 2005/0139847 | A1 | 6/2005 | Kim et al. |
| 2006/0118798 | A1 | 6/2006 | Lee |
| 2006/0157721 | A1 | 7/2006 | Tran et al. |
| 2007/0096127 | A1 | 5/2007 | Pattison et al. |
| 2008/0006836 | A1 | 1/2008 | Lee |
| 2010/0072500 | A1 | 3/2010 | Herrmann |

FOREIGN PATENT DOCUMENTS

| CN | 101084583 A | 12/2007 |
| DE | 102007004304 A1 | 7/2008 |
| EP | 1533851 A2 | 5/2005 |
| JP | 2007-207869 A | 8/2007 |
| KR | 10-2005-0070459 A | 7/2005 |
| KR | 10-2006-0059783 A | 6/2006 |
| WO | WO 03/038913 A2 | 5/2003 |

OTHER PUBLICATIONS

Abstract and English translation of JP 2007-207869A.
Abstract and English translation of KR 10-2005-0070459A.

* cited by examiner

*Primary Examiner* — Minh-Loan T Tran
(74) *Attorney, Agent, or Firm* — Birch, Stewart, Kolasch & Birch, LLP

(57) ABSTRACT

Disclosed are a semiconductor light emitting device. The semiconductor light emitting device comprises a light emitting structure comprising a plurality of compound semiconductor layers, a passivation layer at the outside of the light emitting structure, a first electrode layer on the light emitting structure, and a second electrode layer under the light emitting structure.

8 Claims, 6 Drawing Sheets

SEMICONDUCTOR LIGHT EMITTING DEVICE

CROSS-REFERENCE TO RELATED APPLICATIONS

The application is a Continuation of application Ser. No. 12/950,449 filed on Nov. 19, 2010, now U.S. Pat. No. 8,115,227 which is a Continuation of application Ser. No. 12/580,828 filed on Oct. 16, 2009, now U.S. Pat. No. 7,859,003, and for which priority is claimed under 35 U.S.C. 120; and this application claims priority of Application No. 10-2008-0101642 filed in the Republic of Korea on Oct. 16, 2008 under 35 U.S.C. 119; the entire contents of all are hereby incorporated by reference.

BACKGROUND

The embodiment relates a semiconductor light emitting device.

Group III-V nitride semiconductors are spotlighted as core materials of light emitting diodes (LEDs) or laser diodes (LDs) due to physical and chemical characteristics. The group III-V nitride semiconductors mainly comprise semiconductor materials having a composition formula of $In_xAl_yGa_{1-x-y}N$ ($0 \leq x \leq 1$, $0 \leq y \leq 1$, $0 \leq x+y \leq 1$).

The LED is a kind of a semiconductor device, which transmits/receives signals by converting electricity into infrared rays or light using the characteristic of the compound semiconductor and is used as a light source.

The LED and LD employing such nitride semiconductors have been mainly used in light emitting devices to obtain light, and have been applied to various appliances (e.g., a light emitting part of a keypad of a portable phone, an electric bulletin board, an illumination device) as a light source.

SUMMARY

The embodiment provides a semiconductor light emitting device comprising reflective electrode layers provided on/under a light emitting structure.

The embodiment provides a semiconductor light emitting device comprising electrode parts having a plurality of openings on/under a light emitting structure.

The embodiment provides a semiconductor light emitting device, in which chips can be die-bonded through four side walls or an angle of 360° without using a wire by providing a passivation layer at the outside of the light emitting structure.

An embodiment provides a semiconductor light emitting device comprising: a light emitting structure comprising a plurality of compound semiconductor layers; a passivation layer at the outside of the light emitting structure; a first electrode layer on the light emitting structure; and a second electrode layer under the light emitting structure.

An embodiment provides a semiconductor light emitting device comprising: a light emitting structure comprising a first conductive semiconductor layer, an active layer on the first conductive semiconductor layer, and a second conductive semiconductor layer on the active layer; a first electrode layer comprising a first opening part on the second conductive semiconductor layer; a first conductive support member comprising the first opening part on the first electrode layer; a second electrode layer under the first conductive semiconductor layer; and a second conductive support member under the second electrode layer.

An embodiment provides a semiconductor light emitting device comprising a light emitting structure comprising a first conductive semiconductor layer, an active layer, and a second conducive semiconductor layer, a first electrode layer comprising a reflective electrode on the second conductive semiconductor layer, a first conductive support member under the first electrode layer, a second electrode layer comprising a reflective electrode under the first conductive semiconductor layer, a second conductive support member under the second electrode layer, at least one opening part on and/or under the light emitting structure, and a passivation layer around a circumference portion of the light emitting structure.

The details of one or more embodiments are set forth in the accompanying drawings and the description below. Other features will be apparent from the description and drawings, and from the claims.

DETAILED DESCRIPTION OF THE EMBODIMENTS

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Hereinafter, embodiments will be described with respect to accompanying drawings. In the description about the embodiment, the size of components shown in the accompanying drawings is for an illustrative purpose only, but the embodiment is not limited thereto.

Figure 1:
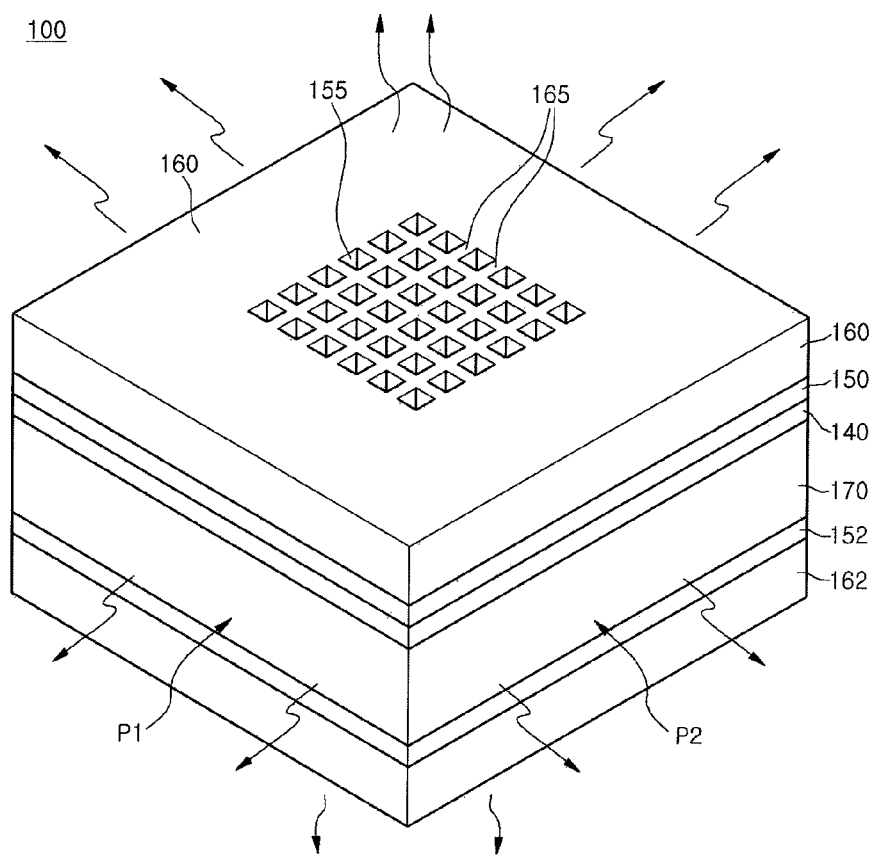
FIG. 1 is a perspective view showing a semiconductor light emitting device according to a first embodiment.
Figure 2:
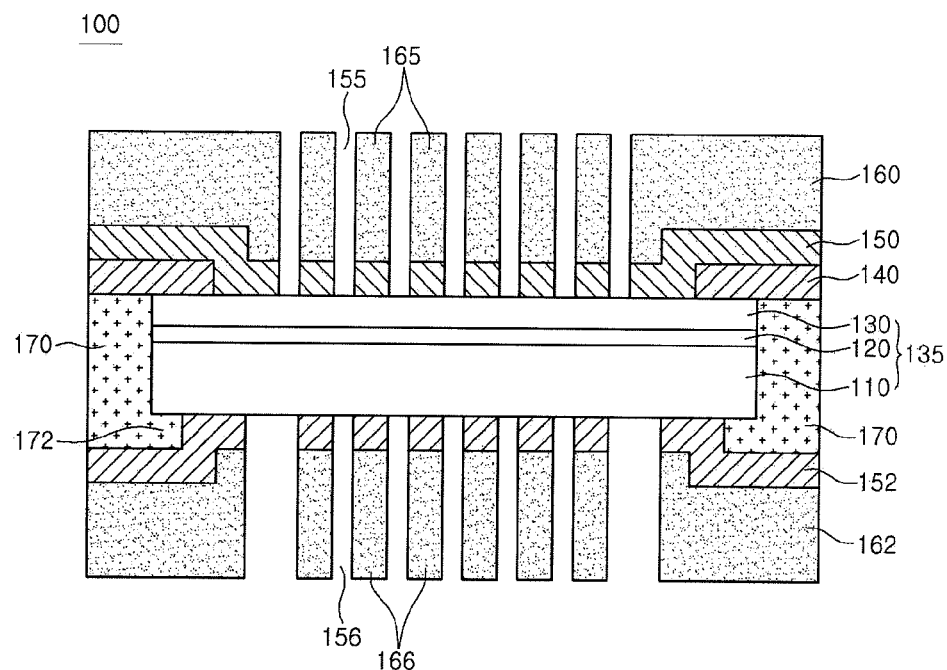
FIG. 2 is a sectional side view of FIG. 1.

FIG. 1 is a perspective view showing a semiconductor light emitting device according to a first embodiment, and FIG. 2 is a sectional side view of FIG. 1.

Referring to FIGS. 1 and 2, a semiconductor light emitting device 100 comprises a light emitting structure 135, a first passivation layer 140, a second passivation layer 170, a first electrode layer 150, a second electrode layer 152, a first conductive support member 160, and a second conductive support member 162.

The semiconductor light emitting device 100 may be realized using light emitting diodes (LEDs) comprising compound semiconductors of groups III-V elements. The LEDs may be color LEDs emitting blue, green or red light or ultraviolet (UV) LEDs. Various LEDs can be employed within the technical scope of the embodiments.

The light emitting structure 135 comprises a first conductive semiconductor layer 110, an active layer 120, and a second conductive semiconductor layer 130.

The first conductive semiconductor layer 110 may comprise one of compound semiconductors of group III-V elements doped with a first conductive dopant. For example, the first conductive semiconductor layer 110 may comprise one selected from the group consisting of GaN, AlN, AlGaN, InGaN, InN, InAlGaN, AlInN, AlGaAs, GaP, GaAs, GaAsP, and AlGaInP. When the first conductive semiconductor is an N-type semiconductor, the first conductive dopant comprises an N-type dopant such as Si, Ge, Sn, Se, or Te. The first conductive semiconductor layer 110 may have a signal layer or multiple layers, but the embodiment is not limited thereto. The first conductive semiconductor layer 110 may be provided on a bottom surface formed thereof with concave-convex roughness in order to improve light extraction efficiency.

The active layer 120 is formed on the first conductive semiconductor layer 110, and may have a single quantum well structure or a multi-quantum well structure. The active layer 120 may have the arrangement of a well layer and a barrier layer using compound semiconductor materials of group III-V elements. For example, the active layer 120 may have the arrangement of an InGaN well layer/a GaN barrier layer, an InGaN well layer/an AlGaN barrier layer, or an InGaN Well layer/an InGaN barrier layer.

A conductive clad layer may be formed on and/or under the active layer 120 and may comprise an AlGaN-based semiconductor.

The second conductive semiconductor layer 130 is formed on the active layer 120. The second conductive semiconductor layer 130 may comprise one selected from the group consisting of GaN, AlN, AlGaN, InGaN, InN, InAlGaN, AlInN, AlGaAs, GaP, GaAs, GaAsP, and AlGaInP which are compound semiconductors of III-V group elements doped with a second conductive dopant. When the second conductive semiconductor is a P-type semiconductor, the second conductive dopant comprises a P-type dopant such as Mg and Zn. The second conductive semiconductor layer 130 may have a single layer or a multi-layer, but the embodiment is not limited thereto.

The light emitting structure 135 may comprise an N-type semiconductor layer or a P-type semiconductor layer on the second conductive semiconductor layer 130. In addition, the first conductive semiconductor layer 110 may be realized as a P-type semiconductor layer, and the second conductive semiconductor layer 130 may be realized as an N-type semiconductor layer. Accordingly, the light emitting structure 135 may have at least one of an N-P junction structure, a P-N junction structure, an N-P-N junction structure, and a P-N-P junction structure.

The first electrode layer 150 is provided on the light emitting structure 135, and the first conductive support member 160 is provided on the first electrode layer 150. A plurality of first openings 155 are formed in the first electrode layer 150 and the first conductive support member 160. The first openings 155 are provided in an inside pattern 165 of the first electrode layer 150 and the first conductive support member 160. For example, the first openings 155 may have a matrix-shape pattern or a stripe-shape pattern.

An ohmic contact layer (not shown) may be interposed between the first electrode layer 150 and the second conductive semiconductor layer 130. The ohmic contact layer (not shown) may have the form of a layer or a pattern. The ohmic contact layer may comprise at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Ag, Ni, Al, Rh, Pd, Ir, Ru, Mg, Zn, Pt, Au, Hf.

The first electrode layer 150 is formed inside a top surface of the second conductive semiconductor layer 130, and the first passivation layer 140 surrounds a circumference portion of the top surface of the second conductive semiconductor layer 130.

The first electrode layer 150 is formed on the first passivation layer 140, and an outer portion of the first passivation layer 140 may extend outwardly from an outside of the light emitting structure 135. Accordingly, the first passivation layer 140 spaces the first electrode layer 150 apart from the light emitting structure 135.

The first passivation layer 140 may have a continuous pattern shape such as a ring shape, a band shape, or a frame shape. For example, the first passivation layer 140 may have a circular shape or a polygonal shape.

The second electrode layer 152 is provided under the light emitting structure 135. The second conductive support member 162 is provided under the second electrode layer 152. A plurality of second openings 156 are formed in the second electrode layer 152 and the second conductive support member 162. The second openings 156 are provided in an inside pattern 166 of the second electrode layer 152 and the second conductive support member 162. For example, the second openings 156 may be formed by a matrix-shape pattern or a stripe-shape pattern.

The first and second openings 155 and 156 may have a circular or a polygonal surface shape. The first and second openings 155 and 156 may be used as a path to emit light upward or downward. The first and second openings 155 and 156 may have various patterns within the technical scope of the embodiment.

An ohmic contact layer (not shown) may be interposed between the second electrode layer 152 and the first conductive semiconductor layer 110. The ohmic contact layer (not shown) may have the form of a layer or a pattern. The ohmic contact layer may comprise at least one selected from the group consisting of ITO, IZO, IZTO, IAZO, IGZO, IGTO, AZO, ATO, GZO, IrOx, RuOx, RuOx/ITO, Ni/IrOx/Au and Ni/IrOx/Au/ITO.

The second electrode layer 152 is provided inside a bottom surface of the first conductive semiconductor layer 110, and a lower portion 172 of the second passivation layer 170 is provided around a circumference portion of the bottom surface of the first conductive semiconductor layer 110. The second passivation layer 170 surrounds a circumference portion of the light emitting structure 135 to prevent short between the layers 110, 120, and 130 on sidewalls of the light emitting structure 135.

The second electrode layer 152 may be formed under the second passivation layer 170, but the embodiment is not limited thereto.

The second passivation layer 170 may have a continuous pattern shape such as a ring shape, a band shape, or a frame shape.

The first electrode layer 150 and the second electrode layer 152 may serve as a reflective electrode layer, and may comprise one selected from the group consisting of Ag, Ni, Al, Rh, Pd, Ir, Ru, Mg, Zn, Pt, Au, Hf, and the combination thereof. The first and second electrode layers 150 and 152 may have the form of a layer or several patterns, but the embodiment is not limited thereto.

The first and second passivation layers 140 and 170 may comprise one of $SiO_2$, $Si_3N_4$, $Al_2O_3$, $TiO_2$, $SiO_x$, and $SiN_x$. The first and second passivation layers 140 and 170, which are transmittive passivation layers, may be used as a path to emit light in a lateral direction of a device.

The first passivation layer 140 may comprise at least one of ITO, IZO, IZTO, IAZO, IGZO, IGTO, AZO, ATO, GZO, IrOx, RuOx, RuOx/ITO, Ni/IrOx/Au and Ni/IrOx/Au/ITO which are transmittive conductive materials.

The first and second conductive support members 160 and 162 may comprise Cu, Au, Ni, Mo, Cu—W, or carrier wafer (e.g., Si, Ge, GaAs, ZnO, SiC, SiGe, GaN). The first and second conductive support members 160 and 162 may be formed through an electrolytic plating scheme or in the form of a sheet, but the embodiment is not limited thereto.

The first electrode layer 150 and the first conductive support member 160 may serve as one electrode part having a predetermined thickness, and the second electrode layer 152 and the second conductive support member 162 may serve as the other electrode part having a predetermined thickness.

Since the first and second conductive support members 160 and 162 are provided at both sides of each side surface P1 or P2, the semiconductor light emitting device 100 can be die-bonded through one side surface and packaged. In this case, the first passivation layer 140 and the second passivation layer 170 can cut off electrical contact between the first and second conductive support members 160 and 162.

In the semiconductor light emitting device 100, the first electrode layer 150 and the first conductive support member 160 serve as a second electrode. The second electrode layer 152 and the second conductive support member 162 serve as a first electrode.

Since outer surfaces of the first and second conductive support members 160 and 162 and the first and second passivation layers 140 and 170 form the same plane, the outer surfaces may be used as a bonding area.

The semiconductor light emitting device 100 can emit light through four side surfaces and top and bottom surfaces. Accordingly, the semiconductor light emitting device 100 can emit light in all directions.

According to the embodiment, one of the first and second openings 155 and 156 is removed to increase an amount of light in the opposite direction.

One of the side surfaces P1 and P2 of the semiconductor light emitting device 100 may be mounted on an electrode of a main substrate through a surface mount technology (SMT) without using a wire. Accordingly, four side surfaces P1 and P2 of the semiconductor light emitting device 100 can be mounted in such a manner that light is emitted in all directions.

FIGS. 3 to 11 are sectional views showing the manufacturing process of the semiconductor light emitting device according to the first embodiment.

Figure 3:
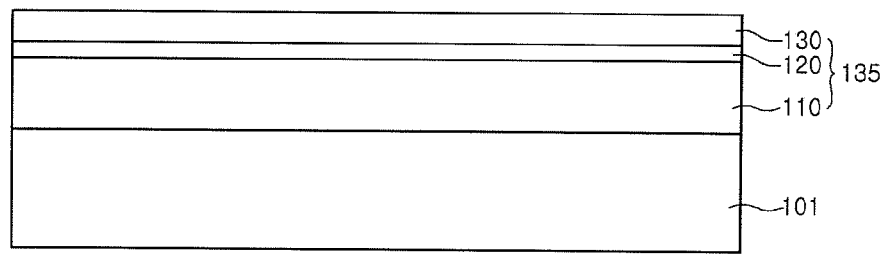
FIGS. 3 to 11 are views showing the manufacturing process of the semiconductor light emitting device according to the first embodiment.
Figure 4:
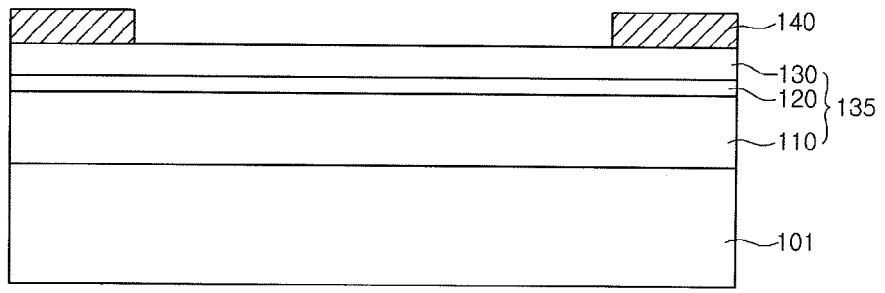

Referring to FIGS. 3 and 4, after a substrate 101 is loaded on growth equipment, a compound semiconductor layer of group II-VI elements is formed on the substrate 101.

The grown equipment may comprise an E-beam evaporator, a physical vapor deposition (PVD) apparatus, a chemical vapor deposition (CVD) apparatus, a plasma laser deposition (PLD) apparatus, a dual-type thermal evaporator, a sputtering apparatus, or a metal organic chemical vapor deposition (MOCVD) apparatus, but the embodiment is not limited thereto.

The substrate 101 may comprise one selected from the group consisting of $Al_2O_3$, GaN, SiC, ZnO, Si, GaP, InP, $Ga_2O_3$, a conductive substrate, and GaAs. The substrate 101 may be provided thereon with a concave-convex pattern. In addition, the substrate 101 may be formed thereon with a layer or a pattern formed using a compound semiconductor of group II to VI elements. For example, the substrate 101 may be formed thereon with at least one of a ZnO layer (not shown), a buffer layer (not shown), and an undoped semiconductor layer (not shown).

The buffer layer and the undoped semiconductor layer may be formed using compound semiconductors of III-V group elements. The buffer layer reduces a lattice constant difference from the substrate 101. The undoped semiconductor layer may be formed using an undoped GaN-based semiconductor.

The light emitting structure 135 comprising a plurality of compound semiconductor layers is formed on the substrate 101. The first conductive semiconductor layer 110 is formed on the substrate 101, and the active layer 120 is formed on the first conductive semiconductor layer 110. The second conductive semiconductor layer 130 is formed on the active layer 120.

The first conductive semiconductor layer 110 may comprise one selected from the group consisting of GaN, AlN, AlGaN, InGaN, InN, InAlGaN, AlInN, AlGaAs, GaP, GaAs, GaAsP, and AlGaInP, which are compound semiconductors of group III-V elements doped with the first conductive dopant. When the first conductive semiconductor is an N-type semiconductor, the first conductive dopant comprises an N-type dopant such as Si, Ge, Sn, Se, or Te. The first conductive semiconductor layer 110 may have a single layer or a multi-layer, but the embodiment is not limited thereto.

The active layer 120 is formed on the first conductive semiconductor layer 110, and may have a single quantum well structure or a multi-quantum well structure. The active layer 120 may have the arrangement of a well layer and a barrier layer using compound semiconductor materials of group III-V elements. For example, the active layer 120 may have the arrangement of an InGaN well layer/a GaN barrier layer.

A conductive clad layer may be formed on and/or under the active layer 120 and may comprise an AlGaN-based semiconductor.

The second conductive semiconductor layer 130 is formed on the active layer 120. The second conductive semiconductor layer 130 may comprise one selected from the group consisting of GaN, AlN, AlGaN, InGaN, InN, InAlGaN, AlInN, AlGaAs, GaP, GaAs, GaAsP, and AlGaInP which are compound semiconductors of III-V group elements doped with a second conductive dopant. When the second conductive semiconductor is a P-type semiconductor, the second conductive dopant comprises a P-type dopant such as Mg or Zn. The second conductive semiconductor layer 130 may have a single layer or a multi-layer, but the embodiment is not limited thereto.

The first conductive semiconductor layer 110, the active layer 120, and the second conductive semiconductor layer 130 may be defined as the light emitting structure 135. In addition, a third conductive semiconductor layer (e.g., an N-type semiconductor layer or a P-type semiconductor layer) may be formed on the second conductive semiconductor layer 130. Accordingly, the light emitting structure 135 may have at least one of an N-P junction structure, a P-N junction structure, an N-P-N junction structure, and a P-N-P junction structure.

Referring to FIG. 4, the first passivation layer 140 is formed on the second conductive semiconductor layer 130 opened by a mask pattern (not shown). The first passivation layer 140 may be formed in a continuous circular or polygonal pattern having a ring shape, a band shape, and a frame shape around a circumference portion of the top surface of the second conductive semiconductor layer 130. The first passivation layer 140 may comprise one of $SiO_2$, $Si_3N_4$, $Al_2O_3$, $TiO_2$, SiO$_x$, and SiN$_x$. The first passivation layer 140 may comprise a transmittive insulating material for emitting light.

The first passivation layer 140 may comprise a transmittive layer. The transmittive layer may comprise at least one of ITO, IZO, IZTO, IAZO, IGZO, IGTO, AZO, ATO, GZO, IrOx, RuOx, RuOx/ITO, Ni/IrOx/Au and Ni/IrOx/Au/ITO.

Figure 5:
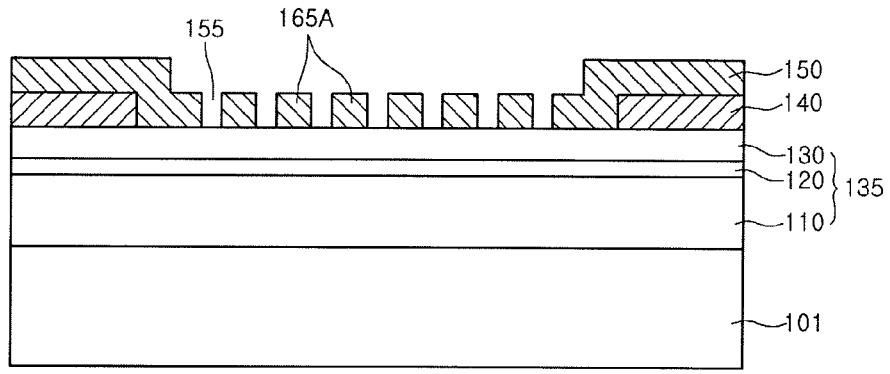
Figure 6:
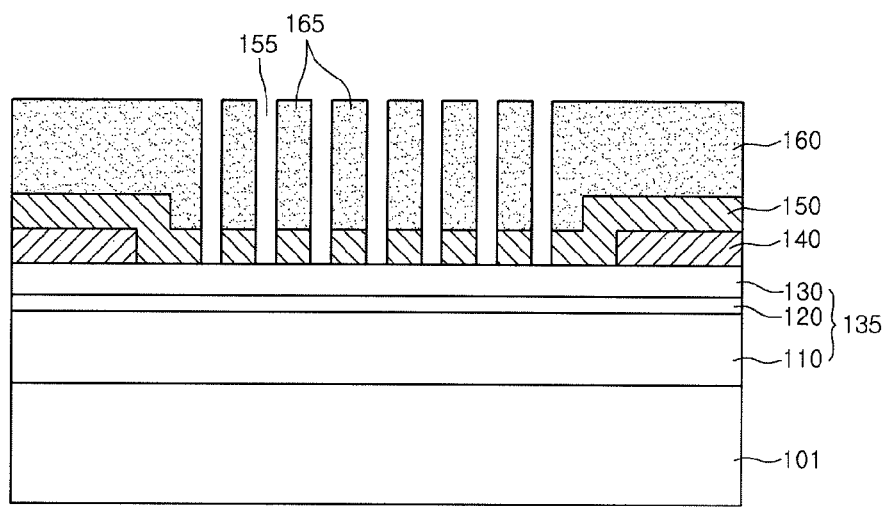

Referring to FIGS. 5 and 6, the first electrode layer 150 is formed on the second conductive semiconductor layer 130. The first electrode layer 150 is formed on both the second conductive semiconductor layer 130 and the first passivation layer 140. A first inside pattern 165A having the first openings 155 is formed on the second conductive semiconductor layer 130 inside the first electrode layer 150.

The first inside pattern 165A of the first electrode layer 150 may be a stripe-pattern or a matrix pattern. The second conductive semiconductor layer 130 is exposed through the first openings 155.

The first openings 155 and the first inside pattern 165A of the first electrode layer 150 may be formed on a region which is open by performing a selective etching process using a mask pattern. In addition, the first openings 155 and the first inside pattern 165A may be formed by performing an etching process after the first electrode layer 150 has been formed, but the embodiment is not limited thereto.

The first electrode layer 150 may serve as a reflective electrode layer, and the first electrode layer 150 may comprise Ag, Ni, Al, Rh, Pd, Ir, Ru, Mg, Zn, Pt, Au, Hf, or the selective combination thereof.

An ohmic contact layer (not shown) may be interposed between the first electrode layer 150 and the second conductive semiconductor layer 130. The ohmic contact layer may comprise a layer or a plurality of patterns, but the embodiment is not limited thereto. The ohmic contact layer may comprise the transmittive conductive materials.

Referring to FIG. 6, the first conductive support member 160 is formed on the first electrode layer 150.

The first openings 155 of the electrode layer 150 are extended in the inside pattern 165 of the first conductive support member 160, and may have a circular or polygonal surface shape.

The first conductive support member 160 may serve as a base substrate, and may comprise Cu, Au, Ni, Mo, Cu—W, or carrier wafer (e.g., Si, Ge, GaAs, ZnO, SiC, SiGe, GaN). The first conductive support member 160 may be formed through an electrolytic plating scheme or in the form of a sheet, but the embodiment is not limited thereto.

The first electrode layer 150 and the first conductive support member 160 may serve as one electrode part having a predetermined thickness The first electrode layer 150 and the first conductive support member 160 may the form of a layer or a pattern. The first conductive support member 160 may have a thickness of about 30 um to about 50 um, but the embodiment is not limited thereto. The first electrode layer 150 and the first conductive support member 160 may serve as one electrode part, but the embodiment is not limited thereto.

Figure 7:
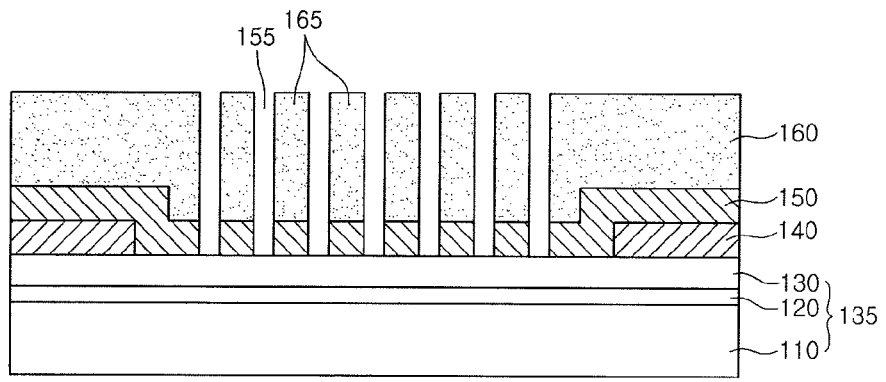

Referring to FIGS. 6 and 7, after the first conductive support member 160 is placed on a base, the substrate 101 is removed. The substrate 101 may be removed through a physical and/or chemical scheme. The physical scheme is a laser lift off (LLO) scheme to separate the substrate 101 by irradiating a laser beam having a predetermined wavelength band to the substrate 101. The chemical scheme is to separate the substrate 101 by removing an additional semiconductor layer (e.g., buffer layer) using a wet etch solution when the additional semiconductor layer is formed between the substrate 101 and the first conductive semiconductor layer 110.

The surface of the first conductive semiconductor layer 110 having no substrate 101 may be polished through an inductively coupled plasma/reactive ion etching (ICP/RIE) scheme.

Figure 8:
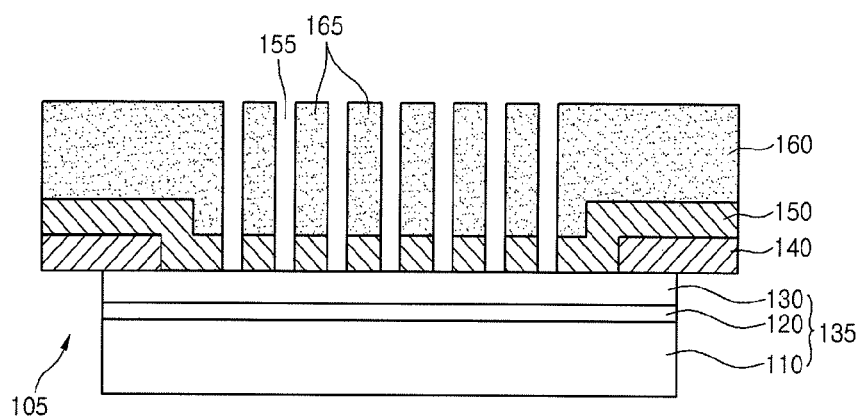

Referring to FIG. 8, a mesa etching is performed. The mesa etching may employ a dry etching scheme and/or a wet etching scheme, but the embodiment is not limited thereto.

Outer portions 105 of the light emitting structure 135 is etched through the mesa etching and removed. The first passivation layer 140 may be exposed through the etched region. A laser beam is irradiated to the first passivation layer 140, thereby preventing metallic fragments generated in the mesa etching from being introduced into the light emitting structure 135 and preventing electrical short between the first and second conductive semiconductor layers 110 and 130 caused by the metallic fragments.

Figure 9:
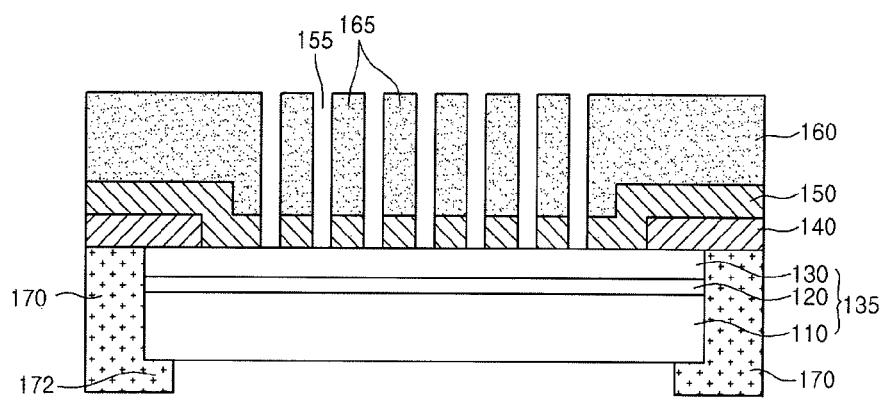

Referring to FIG. 9, the second passivation layer 170 surrounds a circumference portion of the light emitting structure 135. The second passivation layer 170 is formed by using a mask pattern such that the second passivation layer 170 extends from a bottom surface of the first passivation layer 140 and surrounds a lower circumference portion of the first conductive semiconductor layer 110. Accordingly, since the lower portion 172 of the second passivation layer 170 surrounds the circumference portion of the first conductive semiconductor layer 110, a bonding strength can be enhanced.

The second passivation layer 170 is formed on sidewalls of the light emitting structure 135 to prevent short between layers due to external factors. The second passivation layer 170 may have the same material as that of the first passivation layer 140. For example, the second passivation layer 170 may comprise one of SiO$_2$, Si$_3$N$_4$, Al$_2$O$_3$, TiO$_2$, SiO$_x$, and SiN$_x$ or a transmittive insulating material.

Figure 10:
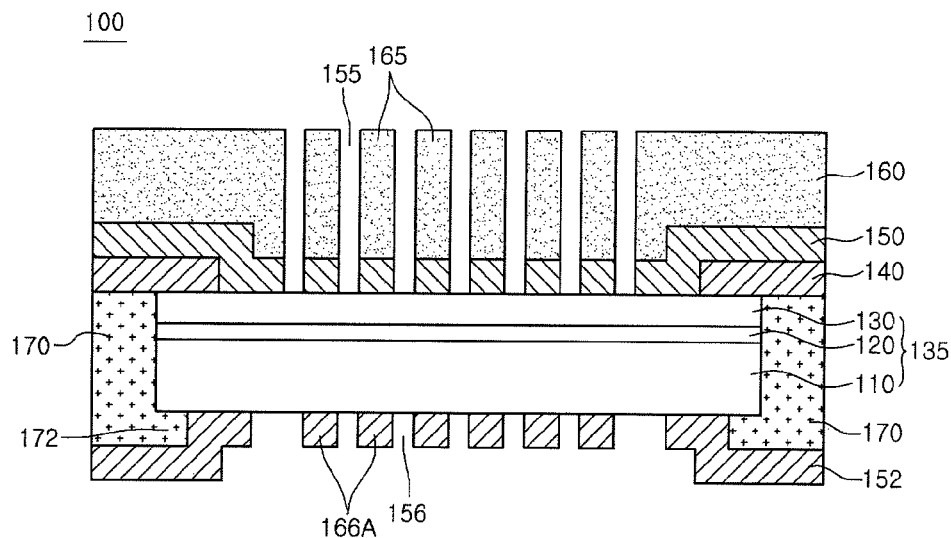
Figure 11:
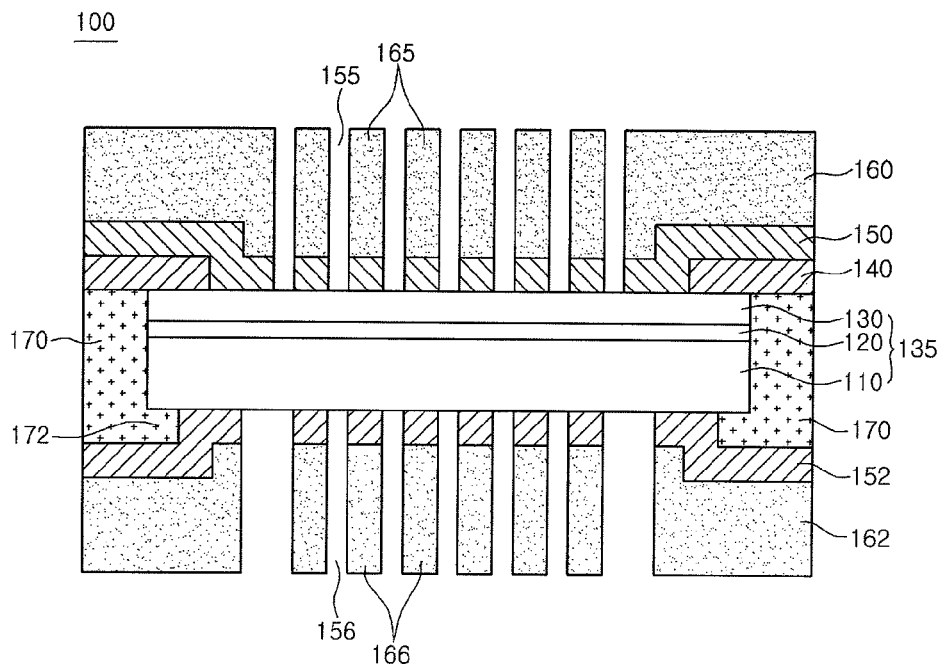

Referring to FIGS. 10 and 11, the second electrode layer 152 is formed under the first conductive semiconductor layer 110. An outer portion of the second electrode layer 152 may extend downward from the second passivation layer 170.

A second inside pattern 166A having the second openings 156 is formed in the second electrode layer 152. The second inside pattern 166A may have a stripe pattern or a matrix pattern. Such a pattern can be variously changed within the scope of the embodiment.

The second openings 156 are formed in the second inside pattern 166A to expose a lower portion of the first conductive semiconductor layer 110. The second openings 156 may be formed through an etching process, or the second electrode layer 152 may be formed after forming a mask pattern in an opening area, but the embodiment is not limited thereto.

The second electrode layer 152 may serve as a reflective electrode layer, and may comprise a material of the first electrode layer 150. For example, the second electrode layer 152 may comprise at least one of Al, Ag, Pd, Rh, and Pt or alloy thereof.

The second conductive support member 162 is formed under the second electrode layer 152, and may comprise a material of the first conductive support member 160. The second conductive support member 162 may be formed through an electrolytic plating scheme or in the form of a sheet, but the embodiment is not limited thereto. The second conductive support member 162 may have a thickness of about 30 um to about 50 um, but the embodiment is not limited thereto.

The second inside pattern 166A of the second conductive support member 162 is formed by extending the second openings 156 of the second electrode layer 152. The second openings 156 may have a circular or polygonal surface shape. The second openings 156 may various surface shapes within the scope of the embodiment.

Referring to FIG. 11, since the outer side surfaces of the first and second conductive support members 160 and 162, and the first and second passivation layers 140 and 170 are arranged on the same plane, four outer side surfaces of the semiconductor light emitting device 100 can be used as bonding areas of the semiconductor light emitting device 100.

Since the first and second conductive support members 160 and 162 are arranged at both sides of each side surface of the semiconductor light emitting device 100, the semiconductor light emitting device 100 may be die-bonded through four outer walls (four side surfaces) or one side surface selected from the four side surfaces within an angle of 360°. The semiconductor light emitting device 100 may be mounted through the SMT without using an additional wire. Accordingly, all four sidewalls of the semiconductor light emitting device 100 can be mounted, and light can be emitted in all side directions.

After placing one of the first conductive support member 160 and the second conductive support member 162 on a base, the semiconductor light emitting device 100 can be wire-bonded through the other conductive support member. Such a mounting structure may be varied within the scope of the embodiment.

The first and second openings 160 and 162 are formed in the semiconductor light emitting device 100, so that heat can be effectively discharged.

A portion or the entire portion of the first and second openings 160 and 162 of the semiconductor light emitting device 100 may comprise a transmittive material, for example, a transmittive conductive layer or a transmittive insulating material. The transmittive material may comprise at least one of $SiO_2$, $Si_3N_4$, $Al_2O_3$, $TiO_2$, $SiO_x$, $SiN_x$, ITO, IZO, IZTO, IAZO, IGZO, IGTO, AZO, ATO, GZO, IrOx, RuOx, RuOx/ITO, Ni/IrOx/Au, and Ni/IrOx/Au/ITO.

The semiconductor light emitting device 100 may not comprise the first openings 165 or the second openings 166. In this case, an amount of reflected light can be increased.

Figure 12:
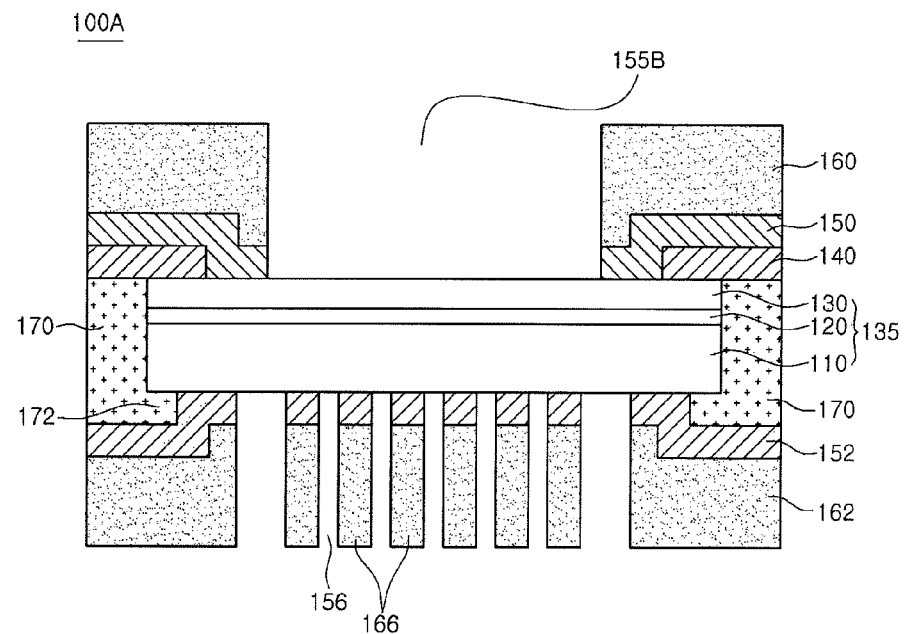
FIG. 12 is a sectional side view showing a semiconductor light emitting device according to a second embodiment.

FIG. 12 is a sectional side view showing a semiconductor light emitting device 100A according to a second embodiment. In the following description, the same reference numerals will be assigned to elements identical to those of the first embodiment, and details thereof will be omitted in order to avoid redundancy.

Referring to FIG. 12, the semiconductor light emitting device 100A comprises the light emitting structure 135, the first and second passivation layers 140 and 170, the first electrode layer 150, the second electrode layer 152, the first conductive support member 160, the second conductive support member 162, and a first opening 155B.

The semiconductor light emitting device 100A comprises the first and second openings 155B and 156 having different sizes.

The first opening 155B opens an internal top surface of the second conductive semiconductor layer 130, and the second openings 156 may have a matrix pattern similarly to that of the first embodiment.

The first electrode layer 150 makes contact with the first conductive support member 160 by a predetermined width along a circumference portion of a top surface of the second conductive semiconductor layer 130. The first electrode layer 150 and the first conducive support member 160 may have a continuous pattern shape such as a circular frame shape or a polygonal frame shape. Accordingly, an internal area of the first electrode layer 150 and the first conductive support member 160 is opened by the first opening 155B.

An ohmic contact layer (not shown) may be formed on the internal top surface of the second conductive semiconductor layer 130. The ohmic contact layer electrically makes contact with the first electrode layer 150 such that a current is diffused and supplied. In addition, the ohmic contact layer can emit light upward.

In the semiconductor light emitting device 100A, some portion or the entire portion of the first opening 155B, which is the internal area of the first electrode layer 150 and the first conductive support member 160, may be filled with a transmittive material, but the embodiment is not limited thereto.

The semiconductor light emitting device 100A has the same mounting structure as that of the first embodiment, so that light extraction efficiency can be improved.

Although an internal upper portion of the light emitting structure 135 is opened in the semiconductor light emitting device 100A, an internal lower portion of the light emitting structure 135 may be opened or an opening part of the second electrode layer formed at the internal lower portion of the light emitting structure 135 may be removed. Such a structure may be varied within the scope of the embodiment.

Figure 13:
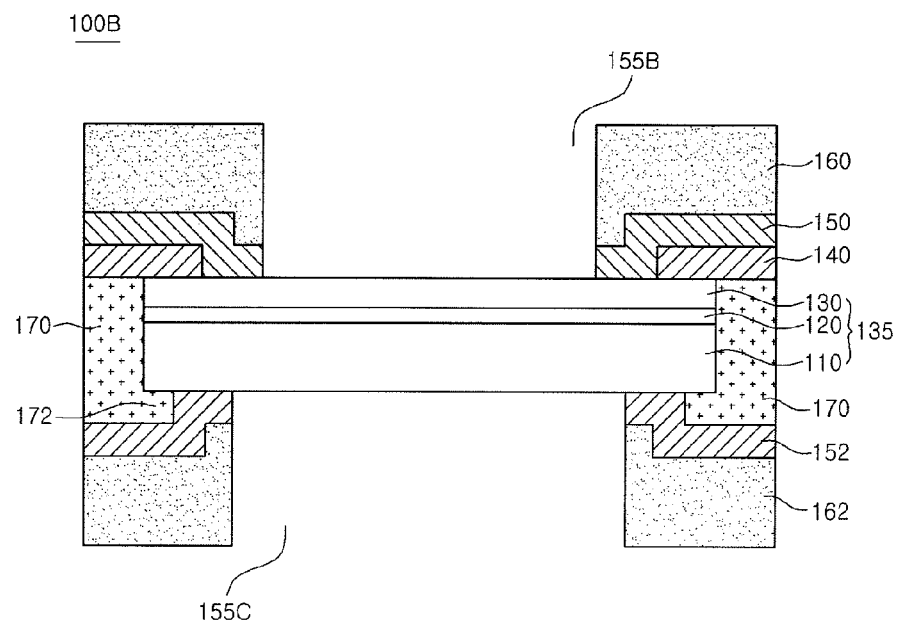
FIG. 13 is a sectional side view showing a semiconductor light emitting device according to a third embodiment.

FIG. 13 is a sectional side view showing a semiconductor light emitting device 100B according to a third embodiment. In the following description, the same reference numerals will be assigned to elements identical to those of the first embodiment, and details thereof will be omitted in order to avoid redundancy.

Referring to FIG. 13, the semiconductor light emitting device 100B comprises the light emitting structure 135, the first and second passivation layers 140 and 170, the first electrode layer 150, the second electrode layer 152, the first conductive support member 160, the second conductive support member 162, the first opening 155B, and a second opening 155C The semiconductor light emitting device 100B comprises a plurality of the first and second openings 155B and 155C.

The first opening 155B opens an internal top surface of the second conductive semiconductor layer 130, and the second opening 155C opens an internal bottom surface of the first conductive semiconductor layer 110.

The first electrode layer 150 makes contact with the first conductive support member 160 by a predetermined width along a circumference portion of a top surface of the second conductive semiconductor layer 130. The first electrode layer 150 and the first conducive support member 160 may have a continuous pattern shape such as a circular frame shape or a polygonal frame shape. Accordingly, an internal area of the first electrode layer 150 and the first conductive support member 160 is opened by the first opening 155B.

An ohmic contact layer (not shown) may be formed on the internal top surface of the second conductive semiconductor layer 130. The ohmic contact layer electrically makes contact with the first electrode layer 150 such that a current can be diffused and supplied. In addition, the ohmic contact layer can emit light upward.

The second electrode layer 152 makes contact with the second conductive support member 162 by a predetermined width along a circumference portion of a bottom surface of the first conductive semiconductor layer 110. The second electrode layer 152 and the second conducive support member 162 may have a continuous pattern shape such as a circular frame shape or a polygonal frame shape. Accordingly, an internal area of the second electrode layer 152 and the second conductive support member 162 is opened by the second opening 155C.

In the semiconductor light emitting device 100B, some portions or the entire portion of the first opening 155B, which is the internal area of the first electrode layer 150 and the first conductive support member 160, may be filled with a transmittive material. Some portions or the entire portion of the second opening 155C, which is the internal area of the second electrode layer 152 and the second conductive support member 162, may be filled with a transmittive material. However, the embodiment is not limited to the materials.

The semiconductor light emitting device 100B has the same mounting structure as that of the first embodiment, so that side-directional light extraction efficiency can be improved.

An embodiment provides a method for manufacturing a semiconductor light emitting device, the method comprising: forming a light emitting structure comprising a plurality of compound semiconductor layers on a substrate; forming a first electrode layer having a first opening part on the light emitting structure; forming a first conductive support member having the first opening part on the first electrode layer; removing the substrate under the light emitting structure; forming an passivation layer around a circumference portion of the light emitting structure; forming a second electrode layer having a second opening part under the light emitting structure; and forming a second conductive support member having the second opening part under the second electrode layer.

According to the embodiment, the light emitting device can be packaged through four sidewalls thereof or one sidewall selected from the four sidewalls within an angle of 360°. The embodiment can provide a vertical-type light emitting device applicable to a side view package or a top view package. The embodiment can provide a vertical-type light emitting device capable of emitting light in six lateral directions. According to the embodiment, a pad is not required for a light emitting device. According to the embodiment, a wire is not used, so that light interference caused by the wire does not occur.

As described above, the embodiments can provide a semiconductor light emitting device such as an LED. According to the embodiments, the electrical reliability of the semiconductor light emitting device can be improved. According to the embodiment, the light efficiency of the semiconductor light emitting device can be improved. According to the embodiment, a light source, to which the semiconductor light emitting device is packaged, can be applied to various fields such as illumination, indictors, and displays.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
   a light emitting structure including a first conductive type semiconductor layer, and active layer and a second conductive type semiconductor layer;
   a first reflective electrode layer formed on the light emitting structure, the first reflective electrode layer comprising a plurality of reflective patterns and a plurality of openings between the reflective patterns and having a multi-layer comprising at least one selected from the group consisting of Ag, Ni, Al, Rh, Pd, Ir, Ru, Mg, Zn, Pt, Au, and Hf;
   a second reflective electrode layer formed under the light emitting structure; and
   an insulating layer formed at an outer sidewall of the light emitting structure so as to surround a circumference portion of the light emitting structure.

2. The semiconductor light emitting device according to claim 1, wherein each opening is formed to partially expose the light emitting structure.

3. The semiconductor light emitting device according to claim 1, wherein the reflective patterns are connected to each other.

4. The semiconductor light emitting device according to claim 1, wherein the second reflective electrode layer comprising at least one selected from the group consisting of Al, Ag, Pd, Rh, and Pt.

5. The semiconductor light emitting device according to claim 1, wherein the insulating layer comprises:
   a first insulating layer formed at un upper periphery of the second conductive type semiconductor layer; and
   a second insulating layer formed at a lower periphery of the first conductive type semiconductor layer and formed at a sidewall of the light emitting structure.

6. The semiconductor light emitting device according to claim 1, further comprising:
   a first conductive supporting member on the first reflective electrode layer; and
   a second conductive supporting member under the second reflective electrode layer.

7. The semiconductor light emitting device according to claim 1, wherein the insulating layer comprises a transparent insulating material.

8. The semiconductor light emitting device according to claim 1, wherein the second reflective electrode layer has an opening which is formed to expose a part of the semiconductor layer of the light emitting structure.

* * * * *